US012266416B2

(12) United States Patent
Yang

(10) Patent No.: US 12,266,416 B2
(45) Date of Patent: Apr. 1, 2025

(54) TEST BOARD

(71) Applicant: CHANGXIN MEMORY TECHNOLOGIES, INC., Hefei (CN)

(72) Inventor: Huipeng Yang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 588 days.

(21) Appl. No.: 17/456,079

(22) Filed: Nov. 22, 2021

(65) Prior Publication Data

US 2022/0238176 A1 Jul. 28, 2022

Related U.S. Application Data

(63) Continuation of application No. PCT/CN2021/112452, filed on Aug. 13, 2021.

(30) Foreign Application Priority Data

Jan. 25, 2021 (CN) .......................... 202110097232.3

(51) Int. Cl.
  *G11C 29/56* (2006.01)
  *G11C 29/50* (2006.01)
(52) U.S. Cl.
  CPC ........ *G11C 29/56016* (2013.01); *G11C 29/50* (2013.01); *G11C 2029/5006* (2013.01)
(58) Field of Classification Search
  CPC ............ G11C 29/00–886; G11C 29/56; G11C 29/56016; G01R 31/00–74
  See application file for complete search history.

(56) References Cited

U.S. PATENT DOCUMENTS 8,766,656 B2 7/2014 Malik et al.
2003/0117871 A1* 6/2003 Duesman ............... G11C 29/48
  365/201

(Continued)

FOREIGN PATENT DOCUMENTS

CN 203481783 U 3/2014
CN 207896864 U 9/2018

(Continued)

OTHER PUBLICATIONS

Translation of DE 20 2018 107 179. Apr. 30, 2020. (Year: 2020).*

(Continued)

*Primary Examiner* — Jared Fureman
*Assistant Examiner* — Christopher J Clark
(74) *Attorney, Agent, or Firm* — Kilpatrick Townsend & Stockton LLP

(57) ABSTRACT

The embodiments of the present application provide a test board, which is applied in temperature and humidity tests for a memory module, and includes: a memory slot configured to be connected with the memory module; a power supply terminal configured to supply power to the memory module; an overcurrent protection unit connected in series between the memory slot and the power supply terminal and configured to be blown when the memory module is short-circuited; and an indicating unit connected in series between the overcurrent protection unit and a ground terminal and configured to indicate a state of the overcurrent protection unit. The embodiments of the present application provide a test board capable of indicating temperature and humidity test results.

16 Claims, 6 Drawing Sheets

(56) References Cited

U.S. PATENT DOCUMENTS

| | | |
|---|---|---|
| 2005/0073314 A1 | 4/2005 | Bertness |
| 2007/0159736 A1 | 7/2007 | Kajita |
| 2019/0164851 A1* | 5/2019 | Yoo .................... G01R 31/2879 |

FOREIGN PATENT DOCUMENTS

| | | | |
|---|---|---|---|
| CN | 209658951 U | 11/2019 | |
| CN | 209658955 U | 11/2019 | |
| CN | 110736917 A | 1/2020 | |
| CN | 210898520 U | 6/2020 | |
| CN | 112925683 A | 6/2021 | |
| DE | 202018107179 U1 * | 4/2020 | ............. H01H 85/32 |

OTHER PUBLICATIONS

International Search Report as cited in PCT/CN2021/112452 mailed Sep. 26, 2021, 4 pages.

Zhang Xiaoguo, "The Design And Implementation of NVDIMM-based Non-Volatile Memory System", Southeast University (China Excellent Master's Dissertation Full-text Database (Electronic Journal) (Information Science and Technology Series), vol. 2, 2017), Feb. 15, 2017, vol. 2.

Linfeng Zheng et al, "Experimental Analysis and Modeling of Temperature Dependence of Lithium-Ion Battery Direct Current Resistance for Power Capability Prediction", 2017 20th International Conference on Electrical Machines and Systems (ICEMS). IEEE, 2017.Oct. 5, 2017, pp. 1-4.

Notice of Allowance of the corresponding Chinese application No. 202110097232.3, issued on Mar. 21, 2022.

\* cited by examiner

FIG. 7

TEST BOARD

CROSS-REFERENCE TO RELATED APPLICATIONS

This is a continuation application of International Patent Application No. PCT/CN2021/112452, filed on Aug. 13, 2021, which claims priority to Chinese Patent Application No. 202110097232.3, filed on Jan. 25, 2021, titled "TEST BOARD". International Patent Application No. PCT/CN2021/112452 and Chinese Patent Application No. 202110097232.3 are incorporated into the present application by reference in their entireties.

TECHNICAL FIELD

Embodiments of the present application relate to the field of semiconductors, and in particular to a test board.

BACKGROUND

As the application range of electronic products continues to expand and the power of electronic products continues to rise, what we face is the increasingly harsh environment in which the internal components of electronic products are applied. By way of example, the upper limit for the ambient temperature during application is getting higher and higher. To ensure that electronic products can operate normally in high-temperature and high-humidity environments, these electronic products, especially memory modules, need to be tested in the high-temperature and high-humidity environments before their shipment.

SUMMARY

The embodiments of the present application provide a test board capable of indicating temperature and humidity test results.

The embodiments of the present application provide a test board, which is applied in temperature and humidity tests for a memory module and includes: a memory slot configured to be connected with the memory module; a power supply terminal configured to supply power to the memory module; an overcurrent protection unit connected in series between the memory slot and the power supply terminal and configured to be blown when the memory module is short-circuited; and an indicating unit connected in series between the overcurrent protection unit and a ground terminal and configured to indicate a state of the overcurrent protection unit.

BRIEF DESCRIPTION OF DRAWINGS

The exemplary descriptions of one or more embodiments are made by using the corresponding drawings. These exemplary descriptions are not intended to limit the embodiments. Elements with the same reference numerals in the drawings denote similar elements. Unless otherwise stated, the figures in the accompanying drawings do not constitute a scale limitation.

FIG. 6 and FIG. 7 are schematic signal diagrams of the memory module according to the embodiments of the present application.

DESCRIPTION OF EMBODIMENTS

For a better clarity of the objects, the technical solutions, and the advantages of the embodiments of the present application, the detailed description of the embodiments of the present application is given below in combination with the accompanying drawings. However, the ordinary skills in the art can understand that many technical details are provided in the embodiments of the present application so as to make the readers better understand the present application. However, even if these technical details are not provided and based on a variety of variations and modifications of the following embodiments, the technical solutions sought for protection in the present application can also be realized.

Figure 1:
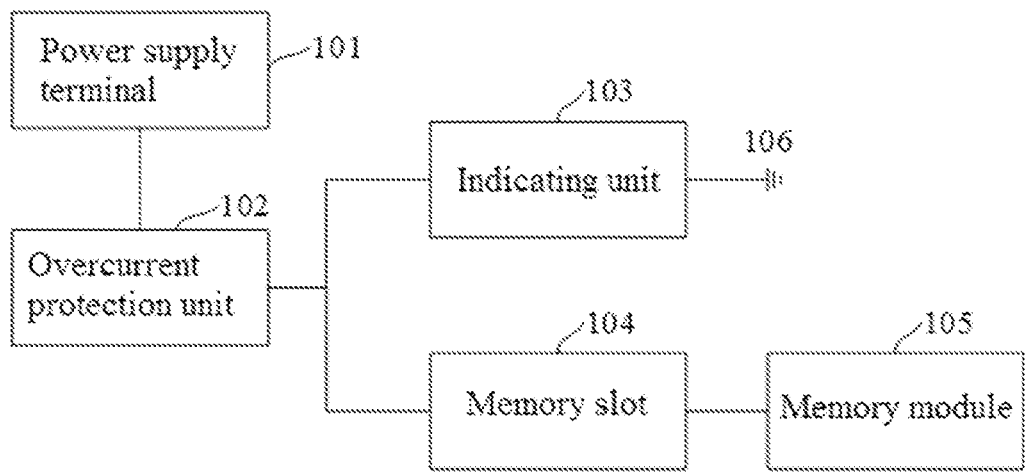
FIG. 1 is a schematic diagram showing functional modules of the test board according to the embodiments of the present application.

Referring to FIG. 1, the test board includes: a memory slot 104 configured to be connected with a memory module 105; a power supply terminal 101 configured to supply power to the memory module 105; an overcurrent protection unit 102 connected in series between the memory slot 104 and the power supply terminal 101 and configured to be blown when the memory module 105 is short-circuited; and an indicating unit 103 connected in series between the overcurrent protection unit 102 and a ground terminal 106 and configured to indicate a state of the overcurrent protection unit 102.

According to the schematic diagram showing the functional modules of the above test board, the current flowing through the overcurrent protection unit 102 increases when the memory module 105 is short-circuited. When the current flowing through the overcurrent protection unit 102 is greater than a rated current, the overcurrent protection unit 102 is blown. Before the overcurrent protection unit 102 is blown, the indicating unit 103 presents a first state under power supply by the power supply terminal 101, and when the overcurrent protection unit 102 is blown because the memory module 105 is short-circuited, the indicating unit 103 presents a second state in a power-off state. It can be easily and timely confirmed from state switching of the indicating unit 103 whether or not the memory module 105 is short-circuited. Also, the fact that the overcurrent protection unit 102 is blown can put the memory module 105 under protection, thus avoiding damages to the samples of the memory module 105 caused by high currents during the short circuit.

The overcurrent protection unit 102 may be a common fuse unit or other structural units, as long as it can be disconnected when overcurrent conditions are met. A detailed description is given below with reference to an example that the overcurrent protection unit 102 is the fuse unit.

In addition, the memory module 105 being short-circuited refers in fact to a reduction in the equivalent resistance of the memory module 105. The reasons for this reduction in the equivalent resistance of the memory module 105 include: occurrence of a short circuit between adjacent bitlines, occurrence of a short circuit between adjacent wordlines, and occurrence of a short circuit between the wordline and the bitline. The memory module 105 being short-circuited does not require that the equivalent resistance of the memory module 105 is reduced to zero.

In the present embodiment, the memory slot 104 may be a dedicated slot prepared for a specific type of memory module 105, e.g., DDR4 memory module, or a universal slot configured for insertion of different types of memory modules 105, e.g., DDR3 memory module and DDR4 memory module. In order to prevent the performance of the memory slot 104 from affecting the accuracy of the test results, it is necessary to perform the temperature and humidity tests on the memory slots 104 first, and then select the qualified memory slot 104 and perform the temperature and humidity tests on the memory module 105. Thus, the accuracy of the final test results is not affected since the memory slot 104 is prevented from being short-circuited during the temperature and humidity tests.

The tests for the memory slot 104 may be performed either separately or as a part of the test board. That is, the overall test board is tested before the memory module 105 is subjected to the temperature and humidity tests, which ensures that the power supply terminal 101, the fuse unit 102, the indicating unit 103 and the memory slot 104 have excellent and stable performance and also avoids that the accuracy of the test results is affected by the components in the test board. The power supply terminal 101 may be a power supply, and may also be an internal interface configured for connection with an external power supply.

The indicating unit 103 is configured to characterize short-circuiting of the memory module 105 through state switching. The types of the states before and after switching by the indicating unit 103 are not limited. The states before and after switching by the indicating unit 103 may not fall into the same type. For example, the indicating unit 103 may be an indicator lamp. The indicating unit 103 stays unlit when the performance of the memory module 105 is normal, and is lit up when the memory module 105 is short-circuited; alternatively, the indicating unit 103 stays lit when the performance of the memory module 105 is normal, and sends warning information to a designated contact when the memory module 105 is short-circuited. As such, the indicating requirements in different application scenarios can be met, more efficient and simpler indicating means can be offered, and the test efficiency is improved as the applicable environment is expanded.

Given below is an example that the indicating unit 103 is a light-emitting diode. The indicating unit 103 stays lit when the performance of the memory module 105 is normal, and is extinguished when the memory module 105 is short-circuited.

Figure 2:
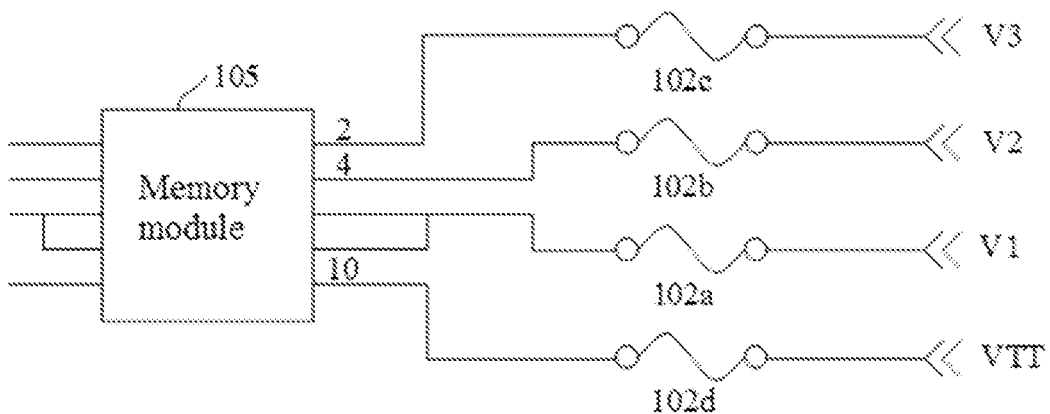
FIG. 2 to FIG. 5 are schematic circuit diagrams of the test board according to the embodiments of the present application.

With reference to FIG. 1 and FIG. 2, in the present embodiment, the power supply terminal 101 is configured to at least provide a first voltage V1 and a second voltage V2. The first voltage V1 is configured to supply power to the memory module 105 through a first fuse unit 102a and a first pin (not illustrated), and the second voltage V2 is configured to supply power to the memory module 105 through a second fuse unit 102b and a second pin 4. By providing different pins with the power supply voltages suitable for these pins, it is helpful to ensure that the temperature and humidity resistances of the memory module 105a while operating through different pins meet the temperature and humidity resistance requirements, and further that the memory module 105 can operate efficiently in high-temperature and high-humidity environments.

Wherein, the sub-components in the memory module 105 that are connected to different pins are not completely different, the power supply voltages of the pins of the same type are generally the same, and the power supply voltages of the pins of different types are generally different. The memory module 105 that is powered by different pins may have a change in its temperature and humidity resistances due to the different sub-components connected to the pins or the different power supply voltages of the pins.

Assume that the memory module 105 has first temperature and humidity resistances when the first voltage V1 is provided via the first pin for the first sub-component of the memory module 105 for power supply, and has second temperature and humidity resistances when the second voltage V2 is provided via the first pin for the first sub-component of the memory module 105 for power supply. When the voltage actually provided by the power supply terminal 101 is the second voltage V2, the temperature and humidity resistances of the memory module 105 change from the first temperature and humidity resistances to the second temperature and humidity resistances under the effect of the actual operating voltage, and the temperature and humidity resistances attained from the actual tests are the second temperature and humidity resistances. This leads to the situation that the actual test results are different from the temperature and humidity resistances of the memory module 105 under rated operating voltage conditions, so it cannot be accurately determined whether or not the temperature and humidity resistances of the memory module 105 in the actual operating state can meet the requirements, the test purposes cannot be achieved, and it is impossible to make improvements in accordance with the test results.

Therefore, the accuracy of the test results can be improved, by providing adaptable power supply voltages to pins with different rated operating voltages such that the temperature and humidity resistances during the test process are similar to, or even identical to the temperature and humidity resistances in the actual operating state. In addition, it is assumed that different pins of the same type have different rated operating voltages, or the operating voltage of the same pin changes greatly during its ideal operation. Use of different power supply voltages for the temperature and humidity tests for different pins of the same type, and use of different power supply voltages for multiple temperature and humidity tests for the same pin can improve the quality of the memory module 105, avoid the situation where the memory module 105 fails to adapt to the temperature and humidity environment owing to the change in the operating voltage or the operating pin, ensure that the temperature and humidity resistances of the memory module 105 in any operating state can meet the preset temperature and humidity requirements, and further expand the applicable range of the memory module 105.

It is to be noted that when the power supply terminal 101 can only provide one voltage signal at the same moment, the power supply terminal 101 needs to regulate its own output voltage, to perform the tests for the first voltage V1 and the second voltage V2 in sequence. The test for the first voltage V1 may include a voltage test for a single pin and voltage tests for a plurality of pins, and the same applies to the test for the second voltage V2. When the power supply terminal 101 can provide a plurality of different voltage signals at the same moment, the tests for the plurality of different voltage signals can be performed simultaneously. The test efficiency can be improved if the power supply terminal 101 that can provide a plurality of voltage signals at the same moment is used in the tests.

The power supply terminal 101 may include a plurality of sub-power supply terminals, and different sub-power supply terminals provide different voltage signals; alternatively, the power supply terminal 101 includes a plurality of power supply lines, and different power supply lines are configured to receive different voltage signals that come from the outside.

In the present embodiment, a first indicating unit (not illustrated) and a second indicating unit (not illustrated) are also set to indicate the states of different fuse units 102, respectively. The first indicating unit is connected in series between the first fuse unit 102a and the ground terminal 106, the second indicating unit is connected in series between the second fuse unit 102b and the ground terminal 106. As such, it can be indicated by the first indicating unit whether or not the memory module 105 powered by the first pin is short-circuited, and it can be indicated by the second indicating unit whether or not the memory module 105 powered by the second pin is short-circuited, i.e., the operating state of the memory module 105 at the time of short circuiting is accurately determined from the states of the plurality of indicating units, and accordingly targeted analysis and improvements can be made.

Different indicating units may have the same or different structures, and these different structures may lead to different indicating ways, including different indicating lights. For example, the light-emitting diode in the first indicating unit is a green light-emitting diode, and the light-emitting diode in the second indicating unit is a blue or red light-emitting diode. Furthermore, the different structures may also be used to adapt to different power supply voltages, such that the power supply voltage provided by the power supply terminal is capable of driving the corresponding indicating unit, or controlling state switching of the indicating unit.

Figure 3:
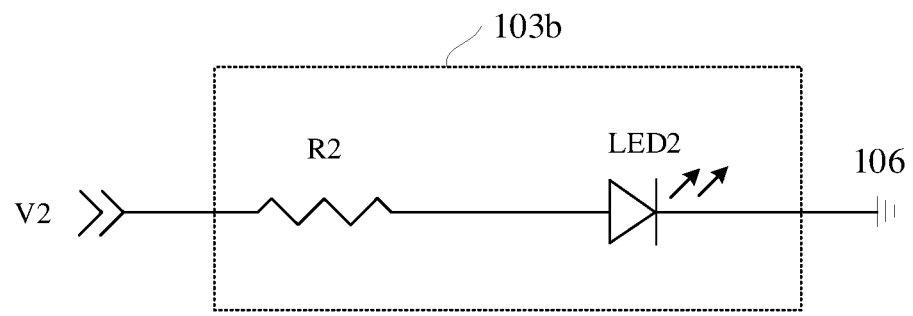

In the present embodiment, referring to FIG. 3, the second voltage V2 is greater than or equal to a turn-on voltage of the second indicating unit 103b, the second indicating unit 103b includes a second current limiting resistor R2 and a second light-emitting diode LED2 connected in series. Wherein, the second voltage V2 is greater than a driving voltage of the second light-emitting diode LED2, and the second light-emitting diode LED2 can emit light under the power supply of the second voltage V2, i.e., the second light-emitting diode LED2 can be driven entirely by the second voltage V2.

The resistance value of the second current limiting resistor R2 may be set as 1 kΩ; and in other embodiments, the current limiting resistor may not be set.

Figure 4:
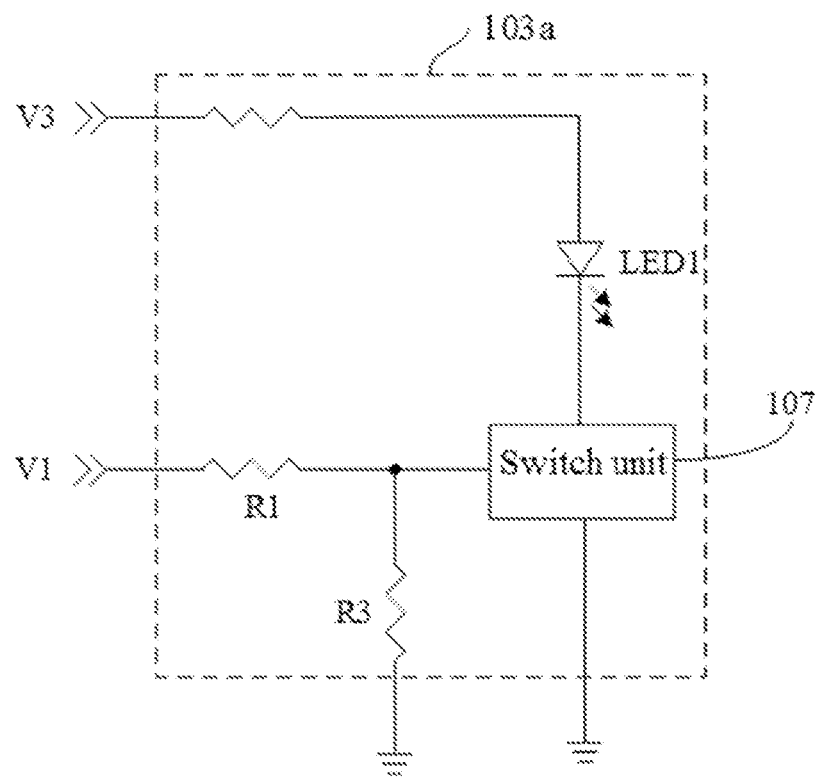

In the present embodiments, referring to FIG. 4, the turn-on voltage of a first light-emitting diode LED1 in the first indicating unit 103a is greater than the first voltage V1, the first light-emitting diode LED1 cannot be driven by the first voltage V1, and the first voltage V1 can serve merely as an auxiliary voltage for controlling state switching of the first light-emitting diode LED1 indirectly.

Wherein, the first indicating unit 103a includes a switch unit 107 and the first light-emitting diode LED1, a first end of the switch unit 107 is connected with an output end of the first fuse unit 102a, a second end of the switch unit 107 is connected with a negative electrode of the first light-emitting diode LED1, a positive electrode of the first light-emitting diode LED1 is configured to receive a voltage signal that is greater than the turn-on voltage of the first light-emitting diode LED1, and a third end of the switch unit 107 is grounded; wherein when the voltage at the first end is greater than an ON voltage of the switch unit 107, the second end is communicated with the third end, and the ON voltage of the switch unit 107 is less than the turn-on voltage of the first light-emitting diode LED1.

As such, the first light-emitting diode LED1 with the relatively greater turn-on voltage can be controlled to be lit up and extinguished by means of the first voltage V1 with a relatively smaller voltage value, ensuring that the first voltage V1 can be used not only to control the indication from the light-emitting diode, but also to drive the memory module 105 via the pins.

Figure 5:
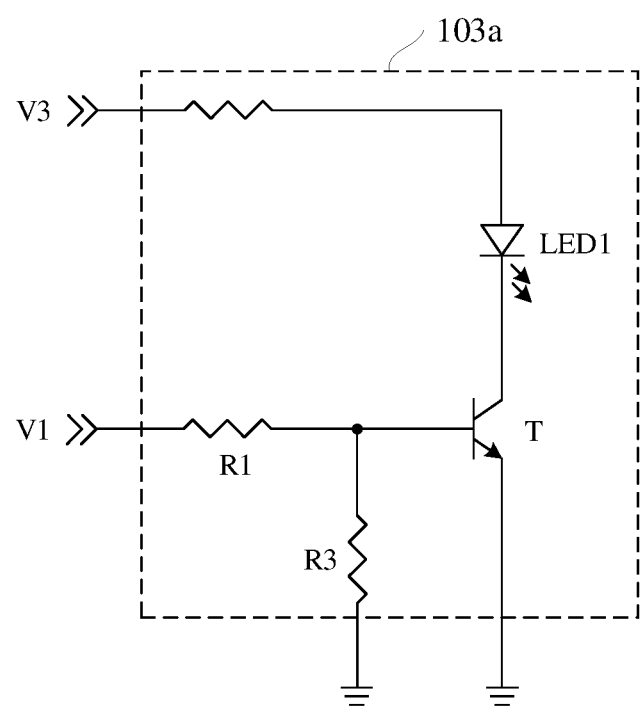

Wherein, with reference to FIG. 5, the switch unit 107 (see FIG. 4) includes a triode T, the first end of the switch unit 107 is a base of the triode T, the second end of the switch unit 107 is a collector of the triode T, and the third end of the switch unit 107 is an emitter of the triode T. The triode T typically has a low ON voltage, the first voltage V1 with the relatively smaller voltage value can control the first light-emitting diode LED1 to be lit up and extinguished by controlling ON and OFF of the triode T, and in this way switching of the indicating effects is accomplished.

In the present embodiment, the triode T is an NPN transistor. Theoretically, when the triode T is an NPN silicon transistor, the triode T can be turned ON as long as the voltage of the base is approximately 0.7 V greater than the voltage of the emitter, and since the emitter is grounded, the triode T can be turned ON when the voltage of the base of the triode T is greater than 0.7 V. When the triode T is an NPN germanium transistor, the triode T can be turned ON as long as the voltage of the base is approximately 0.3 V greater than the voltage of the emitter, and since the emitter is grounded, the triode T can be turned ON when the voltage of the base of the triode T is greater than 0.3 V.

Hence, with the voltage value of the first voltage V1 being set to be greater than 0.7 V, the triode T can be turned ON and OFF through the first voltage V1, and switching of the indicating effects of the first light-emitting diode LED1 can be further accomplished. It is to be noted that when the triode T is the NPN silicon transistor, the triode T can in fact be turned ON as long as the voltage of the base is approximately 0.5 V greater than the voltage of the emitter, which is to say, in the case where the emitter is grounded, the triode T can be turned ON when the voltage of the base is greater than 0.5 V. As such, the voltage value of the first voltage V1 can be further regulated, and is set above 0.5 V.

In other words, any voltage that is greater than 0.5 V may control, through a structure similar to the first indicating unit 103a, the corresponding light-emitting diode, or other structures that can play a role in indication, so as to realize switching of the indicating states, characterize blowing of the fuse unit caused by overcurrent, and characterize short-circuiting of the memory module 105.

In the present embodiment, the voltage signal which is greater than the turn-on voltage and received by the positive electrode of the first light-emitting diode LED1 may be the second voltage V2 or a third voltage V3 provided by the power supply terminal 101, and may also be other external input signals. The following description is given by exemplarily taking the third voltage V3 as the state switching process of the first light-emitting diode LED1.

In the first indicating unit 103a, the first voltage V1 functions as the ON voltage of the triode T, and when the memory module 105 is in its normal state or the memory module 105 has not yet been short-circuited, the first fuse unit 102a is turned ON, the triode T receives the first voltage V1 and is thus in the ON state, and the third voltage V3 drives the first light-emitting diode LED1 such that it stays lit; when the first pin is short-circuited, the first fuse unit 102a is blown, there is no voltage signal input to the base of the triode T, the triode T is turned OFF, which is equivalent to disconnection of the negative electrode of the first light-emitting diode LED1, and the first light-emitting diode LED1 is extinguished. As such, the first voltage V1 can not only serve as the test voltage for the memory module 105, but also control the first light-emitting diode LED1 to be lit up and extinguished, in order to characterize whether or not the first light-emitting diode LED1 is short-circuited.

In the present embodiment, the first indicating unit 103a further includes: an anti-interference resistor R3, one end of which is connected with the base of the triode T and the other end of which is grounded. This helps to avoid that the test results are affected by clutter signals from the base, and to guarantee the accuracy of the test results.

In the present embodiment, the first indicating unit 103a further includes a first current limiting resistor R1, the first current limiting resistor R1 is connected in series between the first fuse unit 102a and the base of the triode T, and the resistance value of the first current limiting resistor R1 may be set as 1 kΩ; accordingly, the resistance value of the anti-interference resistor R3 may be the same as the resistance value of the first current limiting resistor R1, i.e., 1 kΩ, ensuring that the anti-interference resistor R3 has outstanding anti-interference effects.

In the present embodiment, the power supply terminal 101 provides the same voltage signal for a plurality of pins of the memory module 105. When the memory module 105 is short-circuited due to the power supply from any pin, the fuse unit 102 to which this same voltage signal is corresponding is blown and the corresponding indicating unit 103 switches the state. As such, the states of the plurality of pins can be monitored through one fuse unit 102 and one indicating unit 103, which facilitates increasing the test convenience and reducing the complexity of the test board.

Figure 6:
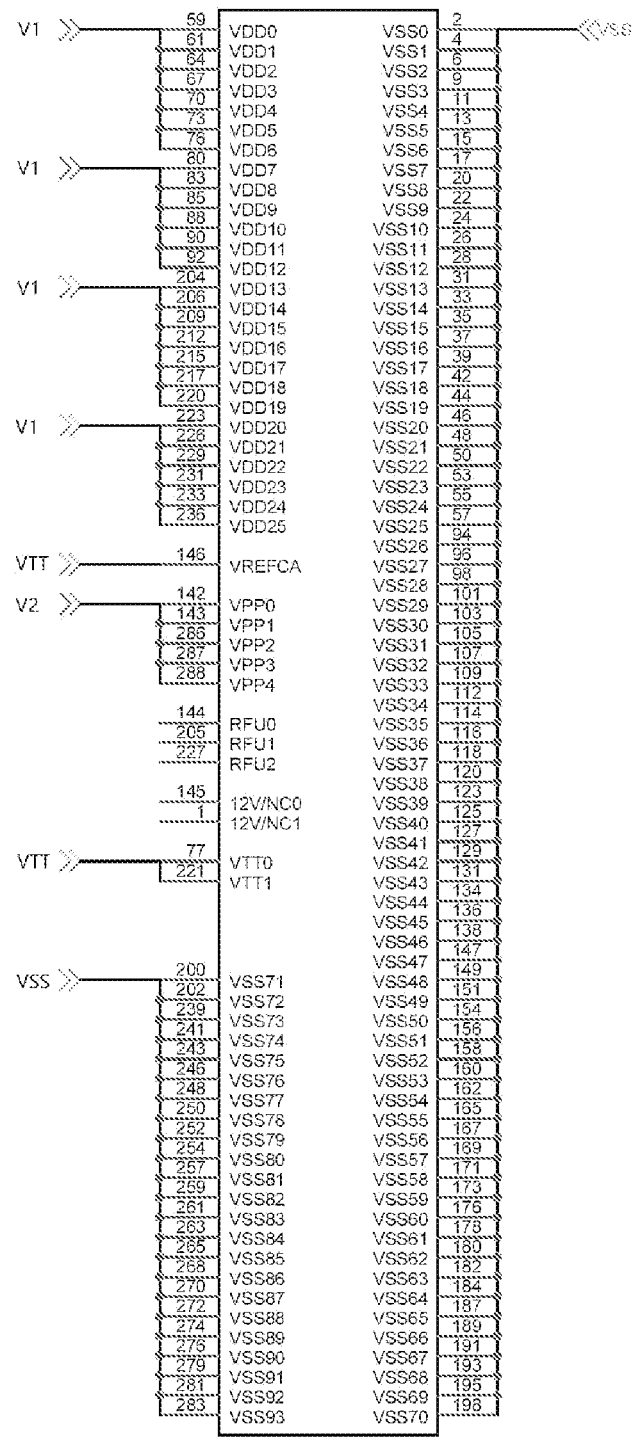
Figure 7:
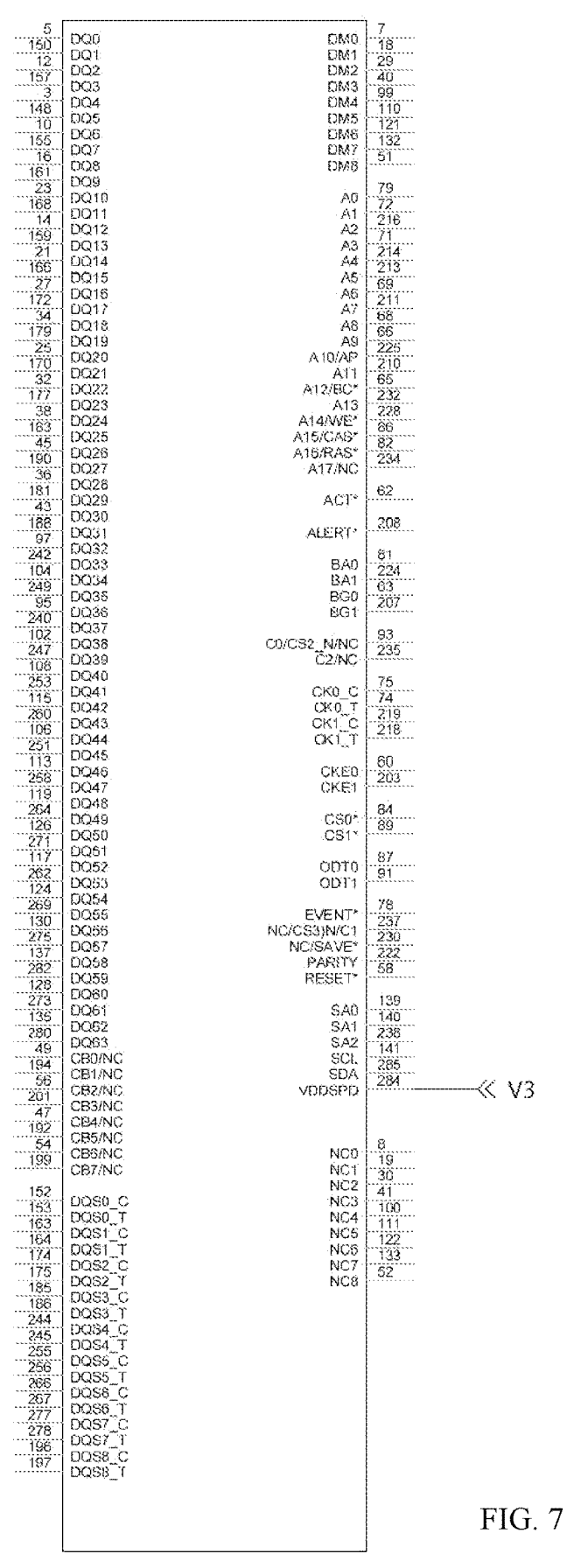

With reference to FIG. 6 and FIG. 7, an example is given that the memory module 105 is a DDR4 UDIMM memory module. FIG. 6 schematically illustrates one surface of the DDR4 UDIMM memory module, and FIG. 7 schematically illustrates another opposite surface of the DDR4 UDIMM memory module. The DDR4 UDIMM memory module has 228 pins, such as pin VSS0, pin VSS1 . . . , pin VSS93, pins VDD0 to VDD25, pin VREFCA, pins VPP0 to VPP4, pins VTT0 and VTT1, pin VDDSPD, or the like.

It is to be noted that FIG. 6 and FIG. 7 are schematic diagrams showing the pins of the standard DDR4 UDIMM memory module, some of the annotations in FIG. 6 and FIG. 7 belong to the existing standard specification for the DDR4 UDIMM memory module and shall not be construed as reference numerals in the accompanying drawings.

In the present embodiment, the first voltage V1 is configured to supply power to the memory module 105 via pins VDD0 to VDD25, and the second voltage V2 is configured to supply power to the memory module 105 via pins VPP0 to VPP4.

In the present embodiment, different power supply branches are employed to provide a same power supply voltage, so as to supply power to different pins of the same type, respectively. Each power supply branch has the corresponding fuse unit 102 and the indicating unit 103. This helps to reduce the number of pins to be powered corresponding to each power supply branch, narrow the range of troubleshooting for the short-circuited pins when the fuse unit 102 is blown, and lower the difficulty of fault confirmation and labor consumption.

Wherein, the power supply terminal 101 has 4 power supply branches that provide the first voltage V1, the first power supply branch is configured to supply power to the memory module 105 via pins VDD0 to VDD6, the second power supply branch is configured to supply power to the memory module 105 via pins VDD7 to VDD12, the third power supply branch is configured to supply power to the memory module 105 via pins VDD13 to VDD 19, and the fourth power supply branch is configured to supply power to the memory module 105 via pins VDD20 to VDD25.

Referring to FIG. 2, FIG. 6 and FIG. 7, the power supply terminal 101 also provides a reference voltage VTT and the third voltage V3, the second voltage V2 is greater than the first voltage V1, the third voltage V3 is greater than the second voltage V2. Wherein, the third voltage V3 is configured to supply power to the memory module 105 through a third fuse unit 102c and a third pin 2, the third pin 2 includes the pin VDDSPD, the reference voltage VTT is configured to supply power to the memory module 105 via a reference fuse unit 102d and a reference pin 10, and the reference pin includes the pin VTT0, the pin VTT1 and the pin VREFCA.

In the present embodiment, the ground pins (pin VSS0 to pin VSS93) of the memory slot 104 are connected with the ground terminal 106, and the power supply terminal 101 may be configured to supply power to a plurality of memory modules 105.

Figure 8:
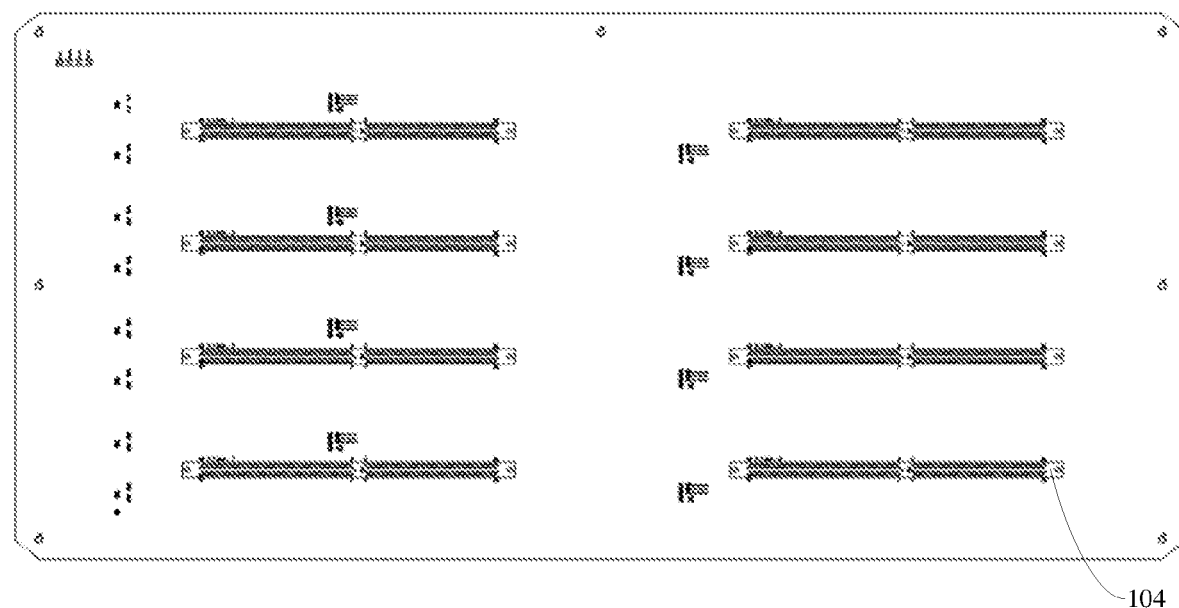
FIG. 8 is a schematic structural diagram of the test board according to the embodiments of the present application.

In the present embodiment, the first voltage V1 may be set as 1.26 V, the second voltage V2 may be set as 2.75 V, the third voltage V3 may be set as 3.3 V, and the reference voltage VTT may be set as 0.6 V. Other parameters related to the test boards may be set as follows: referring to FIG. 8, the test boards have a size of 20 mm*40 mm, the test boards themselves have been subjected to temperature and humidity tests at 85° C. and under 85% RH, each test board may include 7 to 8 memory slots 104, each memory slot 104 corresponds to at least one fuse unit 102, and the fuse unit 102 may have a rated operating current of 2 A.

In the present embodiment, the indicating unit is utilized to characterize the state of the overcurrent protection unit, which is related to whether or not the memory module is short-circuited. As a result, it can be easily and effectively characterized through the indicating unit whether or not the memory module is short-circuited. Further, it can be determined whether or not the memory module satisfies the temperature and humidity requirements, depending on the states of the indicating unit that are corresponding to different environmental parameters during the temperature and humidity tests.

The ordinary skills in the art can understand that the implementations described above are particular embodiments for implementing the present application. In practical uses, various changes in forms and details may be made to the implementations without departing from the spirit and scope of the present application. Any skills in the art may make their own changes and modifications without departing from the spirit and scope of the present application. Therefore, the protection scope of the present application shall be subject to the protection scope of the claims.

What is claimed is:

1. A test board, which is applied in temperature and humidity tests for a memory module and comprises:
 a memory slot configured to be connected with the memory module;
 a power supply terminal configured to supply power to the memory module;
 an overcurrent protection unit connected in series between the memory slot and the power supply terminal and configured to be blown when the memory module is short-circuited; and
 an indicating unit connected in series between the overcurrent protection unit and a ground terminal and configured to indicate a state of the overcurrent protection unit;

wherein the power supply terminal is configured to at least provide a first voltage and a second voltage, the second voltage is greater than the first voltage, the first voltage is used to supply power to a first pin of the memory module through a first protection unit of the overcurrent protection unit, and the second voltage is used to supply power to a second pin of the memory module through a second protection unit of the overcurrent protection unit.

2. The test board according to claim 1, wherein the indicating unit comprises a first indicating unit and a second indicating unit, the first indicating unit is connected in series between the first protection unit and the ground terminal, and the second indicating unit is connected in series between the second protection unit and the ground terminal.

3. The test board according to claim 2, wherein the second voltage is greater than or equal to a turn-on voltage of the second indicating unit, the second indicating unit comprises a current limiting resistor and a light-emitting diode connected in series.

4. The test board according to claim 2, wherein the first voltage is less than the turn-on voltage of the first indicating unit, the first indicating unit comprises a switch unit and a light-emitting diode, a first end of the switch unit is connected with an output end of the first protection unit, a second end of the switch unit is connected with a negative electrode of the light-emitting diode, a positive electrode of the light-emitting diode is configured to receive a voltage signal that is greater than the turn-on voltage, and a third end of the switch unit is grounded; wherein when a voltage at the first end is greater than an ON voltage of the switch unit, the second end is communicated with the third end, and the ON voltage is less than the turn-on voltage.

5. The test board according to claim 4, wherein the switch unit comprises a triode, the first end is a base of the triode, the second end is a collector of the triode, and the third end is an emitter of the triode.

6. The test board according to claim 4, wherein the first indicating unit further comprises an anti-interference resistor, one end of which is connected with the first end and the other end of which is grounded.

7. The test board according to claim 4, wherein the power supply terminal is further configured to provide the voltage signal that is greater than the turn-on voltage.

8. The test board according to claim 1, wherein the power supply terminal is configured to provide a same voltage signal for a plurality of pins of the memory module.

9. The test board according to claim 8, wherein the first voltage is used to supply power to the memory module via pins VDD0 to VDD25 of the memory module, and the second voltage is used to supply power to the memory module via pins VPP0 to VPP4 of the memory module.

10. The test board according to claim 9, wherein the power supply terminal has 4 power supply branches that provide the first voltage, the first power supply branch is configured to supply power to the memory module via pins VDD0 to VDD6, the second power supply branch is configured to supply power to the memory module via pins VDD7 to VDD12, the third power supply branch is configured to supply power to the memory module via pins VDD13 to VDD19, and the fourth power supply branch is configured to supply power to the memory module via pins VDD20 to VDD25.

11. The test board according to claim 1, wherein the power supply terminal is further configured to provide a reference voltage and a third voltage, the second voltage is greater than the first voltage, and the third voltage is greater than the second voltage.

12. The test board according to claim 11, wherein the third voltage is used to supply power to a third pin of the memory module through a third protection unit of the overcurrent protection unit, and the reference voltage is used to supply power to a reference pin of the memory module through a reference protection unit of the overcurrent protection unit.

13. The test board according to claim 12, wherein the reference voltage is used to supply power to the memory module via a pin VTT0, a pin VTT1 and a pin VREFCA, and the third voltage is used to supply power to the memory module via a pin VDDSPD.

14. The test board according to claim 1, wherein a ground pin of the memory slot is connected with the ground terminal.

15. The test board according to claim 1, wherein the power supply terminal is configured to supply power to a plurality of memory modules.

16. The test board according to claim 1, wherein the overcurrent protection unit comprises a fuse unit, and the fuse unit is blown when the memory module is short-circuited.

* * * * *